United States Patent
Fu et al.

(10) Patent No.: US 9,976,041 B2
(45) Date of Patent: May 22, 2018

(54) UV-CURABLE SILICONE COMPOSITIONS AND ANTI-DUST COATING COMPOSITIONS CONTAINING SAME

(71) Applicant: Dow Corning Corporation, Midland, MI (US)

(72) Inventors: Peng-Fei Fu, Midland, MI (US); Eric Moyer, Midland, MI (US); Wei Rong, Midland, MI (US)

(73) Assignee: Dow Silicones Corporation, Midland, MI (US)

( * ) Notice: Subject to any disclaimer, the term of this patent is extended or adjusted under 35 U.S.C. 154(b) by 99 days.

(21) Appl. No.: 15/037,063

(22) PCT Filed: Dec. 22, 2014

(86) PCT No.: PCT/US2014/071952
§ 371 (c)(1),
(2) Date: May 17, 2016

(87) PCT Pub. No.: WO2015/100258
PCT Pub. Date: Jul. 2, 2015

(65) Prior Publication Data
US 2016/0304724 A1 Oct. 20, 2016

Related U.S. Application Data

(60) Provisional application No. 61/920,378, filed on Dec. 23, 2013.

(51) Int. Cl.
| | | |
|---|---|---|
| *C09D 183/06* | (2006.01) | |
| *C09D 5/16* | (2006.01) | |
| *C08G 77/14* | (2006.01) | |
| *H01L 33/56* | (2010.01) | |
| *C08G 77/00* | (2006.01) | |

(52) U.S. Cl.
CPC .......... *C09D 5/1675* (2013.01); *C08G 77/14* (2013.01); *C09D 183/06* (2013.01); *H01L 33/56* (2013.01); *C08G 77/70* (2013.01); *C08G 2150/00* (2013.01); *H01L 2933/005* (2013.01); *H01L 2933/0025* (2013.01); *H01L 2933/0033* (2013.01)

(58) Field of Classification Search
None
See application file for complete search history.

(56) References Cited

U.S. PATENT DOCUMENTS

| | | | | |
|---|---|---|---|---|
| 4,279,717 A * | 7/1981 | Eckberg | ................ | C08G 59/68 428/413 |
| 4,370,358 A * | 1/1983 | Hayes | ..................... | C08L 83/06 427/208.4 |
| 5,310,601 A * | 5/1994 | Riding | .................... | C08L 83/06 428/429 |
| 5,310,843 A * | 5/1994 | Morita | ................... | C08G 77/38 525/478 |
| 5,358,983 A * | 10/1994 | Morita | .................... | C08L 83/06 523/455 |
| 5,360,833 A * | 11/1994 | Eckberg | ............. | C08G 59/3254 522/148 |
| 5,369,205 A * | 11/1994 | Eckberg | ................. | C08G 77/46 522/148 |
| 5,530,075 A * | 6/1996 | Morita | ................. | C08G 59/306 525/393 |
| 5,952,439 A | 9/1999 | Morita et al. | | |
| 6,262,188 B1 * | 7/2001 | Burkus, II | ............. | C08G 77/12 156/329 |
| 6,344,520 B1 | 2/2002 | Greene | | |
| 6,492,433 B1 | 12/2002 | Eckberg | | |
| 7,893,128 B2 * | 2/2011 | Busch | .................. | C09D 183/04 522/148 |
| 2011/0070438 A1 * | 3/2011 | Bahadur | ............... | C03C 25/106 428/391 |

OTHER PUBLICATIONS

Oliver, et. al., "An improved technique for determining hardness and elastic modulus using load and displacement sensing indentation experiments", J. Mater. Res., Jun. 6, 1992, pp. 1564-1583, vol. 7, No. 6, Materials Research Society.

\* cited by examiner

*Primary Examiner* — Robert S Loewe
(74) *Attorney, Agent, or Firm* — Timothy J. Troy

(57) ABSTRACT

Provided in various embodiments are methods for making ultraviolet radiation curable (UV-curable) silicone compositions and the UV-curable silicone compositions prepared by such methods. Provided in various embodiments are methods for making anti-dust coatings using such UV-curable silicone compositions and the anti-dust coatings using such UV-curable silicone compositions prepared by such methods. The UV-curable silicone compositions may be used in the coating of silicone-based articles for LED packages, encapsulants, lamps, luminaires, optical articles and the like, substantially reducing and/or eliminating the pick-up of dust and improving optical properties of the silicone-based articles.

15 Claims, 3 Drawing Sheets

UV-CURABLE SILICONE COMPOSITIONS AND ANTI-DUST COATING COMPOSITIONS CONTAINING SAME

CROSS REFERENCE TO RELATED APPLICATIONS

This application is a U.S. national stage filing under 35 U.S.C. § 371 of PCT Application No. PCT/US14/071952 filed on 22 Dec. 2014, currently pending, which claims the benefit of U.S. Provisional Patent Application No. 61/920,378 filed 23 Dec. 2013 under 35 U.S.C. § 119 (e). PCT Application No. PCT/US14/071952 and U.S. Provisional Patent Application No. 61/920,378 are hereby incorporated by reference.

BRIEF SUMMARY OF THE INVENTION

This disclosure relates generally to ultraviolet radiation curable (UV-curable) silicone compositions and methods of preparing such UV-curable silicone compositions. Further, this disclosure relates to anti-dust coatings using such UV-curable silicone compositions and methods of forming such anti-dust coatings. The UV-curable silicone compositions may be used in the coating of silicone-based articles for LED packages, encapsulants, lamps, luminaires, optical articles and the like, substantially reducing and/or eliminating the pick-up of dust and improving optical properties of the silicone-based articles.

BRIEF DESCRIPTION OF THE DRAWINGS

The foregoing and other advantages of the invention will become apparent upon reading the following detailed description and upon reference to the drawings.

Figure 1:
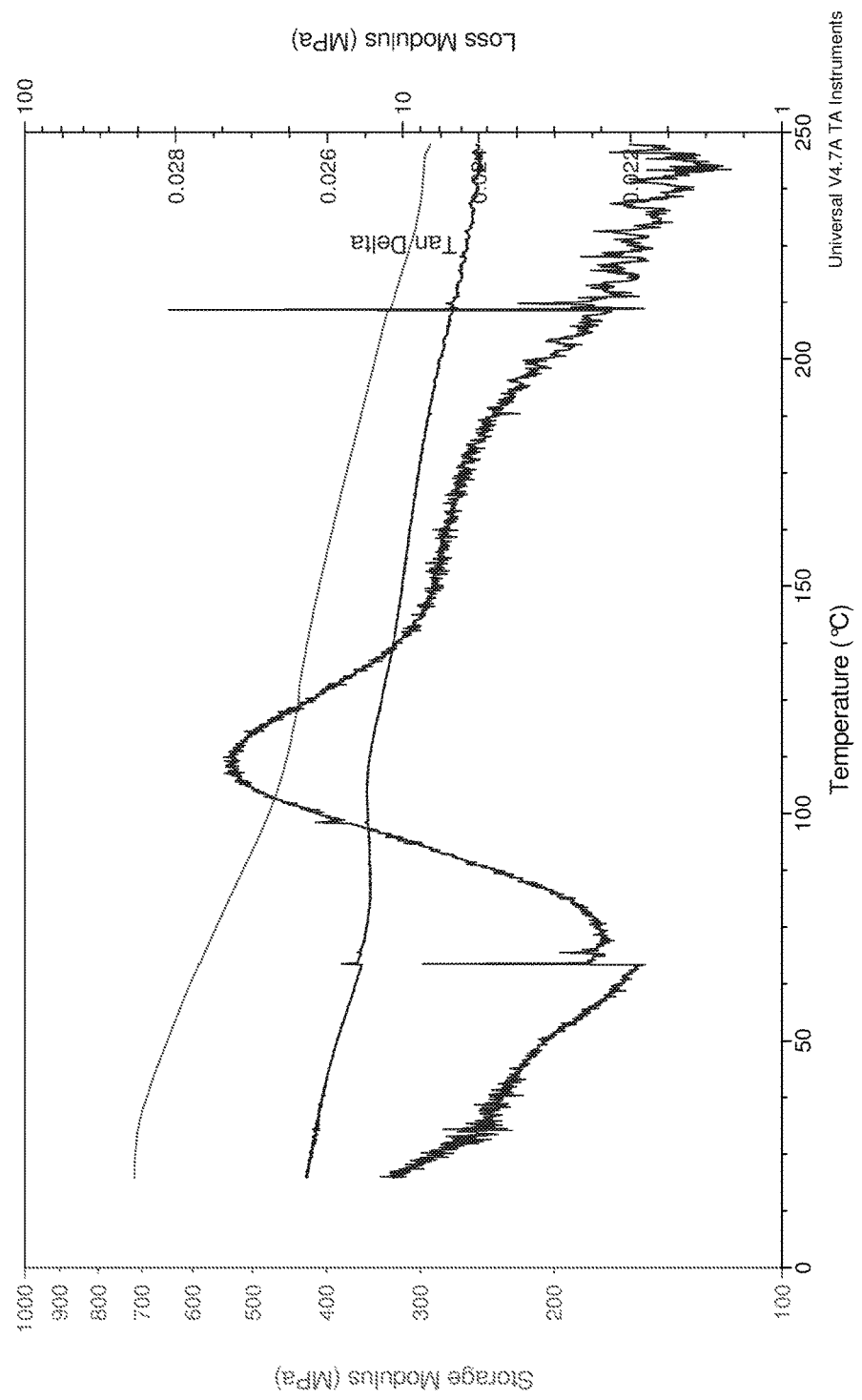
FIG. 1 is a DMA thermogram of the cured sample of Example 3 detailed herein formed using methods of the invention.

While the invention is susceptible to various modifications and alternative forms, specific embodiments have been shown by way of example in the drawings and will be described in detail herein. It should be understood that the invention is not intended to be limited to the particular forms disclosed. Rather, the invention is to cover all modifications, equivalents, and alternatives falling within the spirit and scope of the invention.

DETAILED DESCRIPTION OF THE INVENTION

In the formulas described herein, R is an epoxy group, $R^1$ and $R^2$ are each independently an alkyl group or an aryl group, and $x+y+z=1$. The acronyms such as MQ, MTQ, MDQ, etc. as they relate to silicone resins are derived from the symbols M, D, T, and Q each of which represent a functionality of different types of structural units which may be present in silicone resins containing siloxane units joined by Si—O—Si bonds. Monofunctional (M) unit represents $(CH_3)_3SiO_{1/2}$. Difunctional (D) unit represents $(CH_3)_2SiO_{2/2}$. Trifunctional (T) unit represents $CH_3SiO_{3/2}$ and results in the formation of branched linear siloxanes. Tetrafunctional (Q) unit represents $SiO_{4/2}$ which results in the formation of resinous silicone compositions. The resins consist of the siloxane units of represented by the single letters. In this application, a siloxane unit type having one or more reactive groups (such as an epoxy group, an acrylate group, a thiol group, an alkenyl group, a vinyl ether group, an amino group, a fluoro group, or any combination(s) thereof) is designated by a "'" (prime symbol) combined with the single letter designation.

The present disclosure generally provides UV-curable silicone compositions and methods of making such UV-curable silicone compositions. The UV-curable silicone compositions of the present disclosure can be applied onto silicone-based articles such as moldable silicone-based articles using any coating methods in the art. Upon curing the UV-curable silicone compositions by ultraviolet radiation, an anti-dust coating is formed on the silicone-based articles, substantially reducing and/or eliminating the pick-up of dust and improving the optical properties of the silicone-based articles.

When using silicone-based articles for LED packages, encapsulants, lamps, luminaires (reflector and secondary lens), optical articles and the like, the silicone-based articles tend to have very high surface resistivity and usually have a soft surface. This, in turn, makes the articles prone to accumulate static charge, causing them to attract dust. This, in turn, also lowers the optical transparency of the articles and causes a drop of optical performance (such as the light output) of the articles. In addition, the LED light blocked by the dust is trapped into these articles, which causes temperature increases around the LED chips and shortens the life of the LED devices and decreases their reliabilities. Additionally, the cost for maintaining the cleanliness of the surface of such silicone articles is high. The present disclosure generally provides UV-curable silicone compositions which may be used as anti-dust coatings on such silicone-based articles and which improve the optical and other properties of the silicone-based articles and solve the dust attraction problems associated with such silicone-based articles.

One aspect of the invention relates to a UV-curable silicone composition. The UV-curable silicone composition includes (1) a silicone resin (component (a)) having the general formula:

$$((CH_3)_3SiO_{1/2})_x[(RSiO_{3/2})_a(RR^1SiO_{2/2})_b(RR^1R^2SiO_{1/2})_c]_y(SiO_{4/2})_z \quad \text{Formula (1)}$$

wherein each R is an epoxy group, $R^1$ and $R^2$ are each independently an alkyl group or an aryl group, x, y, z>0, x+y+z=1, a+b+c=y, 0≤a≤y, 0≤b≤y, and 0≤c≤y and (2) a cationic photoinitiator (component (b)). In other words, component (a) is an epoxysilicone resin. The silicone resin (component (a)) may be mixed or otherwise combined with the cationic photoinitiator (component (b)) to form the UV-curable silicone composition.

Where the silicone resin (component (a)) has the formula $((CH_3)_3SiO_{1/2})_x(RSiO_{3/2})_y(SiO_{4/2})_z$, the epoxy silicone resin is an $MT^{Ep}Q$ type resin. In other words, where b and c in Formula (1) equal 0, the resin is an MT'Q resin.

Where the silicone resin (component (a)) has the formula $((CH_3)_3SiO_{1/2})_x(RR^1SiO_{2/2})_y(SiO_{4/2})_z$, the epoxy silicone resin is an $MD^{Ep}Q$ type resin. In other words, where a and c in Formula (1) equal 0, the resin is an MD'Q resin.

Where the silicone resin (component (a)) has the formula $((CH_3)_3SiO_{1/2})_x(RR^1R^2SiO_{1/2})_y(SiO_{4/2})_z$, the epoxy silicone resin is an $MM^{Ep}Q$ type resin. In other words, where a and b in Formula (1) equal 0, the resin is an MM'Q resin.

It is contemplated that each R is an epoxy group such as a glycidoxy group or a 2-(3,4 epoxycyclohexyl) group. Each R is an epoxy group, and the silicone resin of component (a) is, therefore, an epoxy silicone resin. The epoxy group is a three member oxirane ring containing group and may include

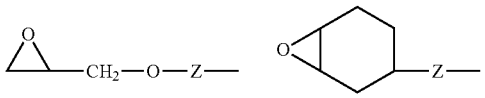

wherein Z is a hydrocarbon chain, including but not limited to, —CH$_2$—, —(CH$_2$)$_2$—, (CH$_2$)$_3$—, —(CHMe-CH$_2$CH$_2$)—, and —(CH$_2$)$_4$—; n=0, 1, or 2. Examples of further suitable epoxy groups for use in the inventive UV-curable silicone compositions include, but are not limited to, 3-glycidoxypropyl, 2-(3,4-epoxycyclohexyl)ethyl, or any combination(s) thereof. The epoxy silicone resins contemplated for use in forming the UV-curable silicone compositions can be made via the hydrolysis/condensation of chlorosilanes or alkoxysilanes or by methods known in the art for forming epoxy silicone resins.

The UV-curable silicone resin compositions can be used in conformal coating, packaging, protective coatings, and patterning in electronics.

Cationic Photoinitiator

The cationic photoinitiator (also referred to as a photoacid generator) contemplated for use in the UV-curable silicone compositions is a chemical that undergoes actinic decomposition upon exposure of UV light. Upon this decomposition, an active cationic species and an anionic species are generated. In other words, the cationic photoinitiator comprises an active cationic species and an anionic species. Generally, the cationic species is a super strong proton (H$^+$) that is capable of inducing the epoxy ring opening polymerization to form crosslinking networks. In some embodiments, the cationic species includes an onium salt. The onium salt may include a diaryliodonium salt, a triarylsulfonium salt, or a tetraaryl phosphonium salt. In some embodiments, the anionic species is selected from the group of BF$_4^-$, PF$_6^-$, AsF$_6^-$, SbF$_6^-$, and (C$_6$F$_5$)$_4$B$^-$. It is contemplated that the cationic photoinitiator may be present in the UV-curable silicone composition from about 0.1 parts by weight to about 2 parts by weight (based on 100 parts by weight of the UV-curable silicone composition). In alternative embodiments, it is contemplated that the cationic photoinitiator may be present at about 1 part by weight (based on 100 parts by weight of the UV-curable silicone composition).

Resulting UV-Curable Silicone Composition

The UV-curable silicone composition may optionally be mixed with one or more organic-based or silicone-based epoxy monomers or polymers. This dilutes the UV-curable silicone composition. This may allow the adjustment of the UV-curable silicone compositions for a desired application or use, including crosslinking density, adhesion properties, and formulation viscosity.

Alternatively or additionally, the UV-curable silicone composition may be mixed with one or more organic or other suitable solvents or mixtures of one or more organic or other suitable solvents to adjust the viscosity of the UV-curable silicone compositions. This may be done to adjust the properties, such as the coating properties, of the UV-curable silicone compositions for a desired application or use. Although not required, the solvent is typically a high boiling point (>80° C.) organic solvent and may be selected from the group of PGMEA, PGME, 2-heptanone, xylene, and combinations thereof.

Alternatively or additionally, the UV-curable silicone composition may include one or more fillers. Examples of suitable fillers for use in the inventive UV-curable silicone compositions include, but are not limited to, silica, metal oxide, and the like. The filler(s) may be used to adjust the properties, such as the coating properties, of the UV-curable silicone compositions for a desired application or use.

The UV-curable silicone composition may also include one or more additives to modify, as necessary, desired physical and chemical properties of the UV-curable silicone composition. Additives typically do not integrate into the crosslinked network and are typically used in relatively small amounts. If included, such additives include, but are not limited to, those selected from the group of stabilizers, adhesion promoters, mold release agents, and combinations thereof. Stabilizers are used to prevent gelation of the UV-curable silicone composition in storage and premature curing, once applied, due to low levels of light exposure. Adhesion promoters, such as 3-glycidoxypropyltrimethoxysilane, are utilized to improve surface adhesion of the substrate (detailed below). Release agents are utilized to reduce the surface energy of the contact surfaces involved in the various techniques.

Use of the UV-Curable Silicone Composition

Once the silicone resin (component (a)) and the cationic photoinitiator (component (b)) are mixed to form the UV-curable silicone composition, the UV-curable silicone composition may be applied onto a substrate. The substrate may be an optically clear silicone substrate, a glass substrate, a metal substrate, or a plastic substrate. The UV-curable silicone composition may be applied onto the surface of the substrate using any suitable coating method including spray coating, dip coating, spin coating and the like to form a liquid coating thereon. The liquid coating can be at any thickness for a desired application. Once applied onto the substrate, the liquid coating may be dried if solvents are used (such as at room temperature) and the liquid coating cured by ultraviolet radiation to harden the liquid coating and form a cured silicone anti-dust coating composition (also referred to herein as an anti-dust coating). The anti-dust coating is a thin, hard layer of material. The inventive anti-dust coatings can be used on various types of articles.

The UV-curable silicone compositions described herein may be applied or incorporated onto silicone-based articles such as LED packages, encapsulants, lamps, luminaires, and/or optical articles such as secondary optical articles. Where an optically clear silicone substrate is used, the optically clear silicone substrate may be a silicone-based moldable LED encapsulant or a secondary optical article.

The inventive anti-dust coatings and associated methods of forming such anti-dust coatings are advantageous in that they substantially reduce and/or eliminate the pick-up of dust (dust attraction) and improve the optical properties of the silicone-based articles upon which they have been applied. The anti-dust coatings have a pencil hardness greater than H as measured by ASTM D3363-05(2011)e2 ("Standard Test Method for Film Hardness by Pencil Test"). As measured on the pencil hardness scale, the anti-dust coatings have a hardness ranging from about 1 H to about 9 H. In some alternative embodiments, the anti-dust coatings have a hardness ranging from about 2 H to about 7 H. In still further embodiments, the anti-dust coatings have a hardness ranging from about 3 H to about 6 H.

The UV-curable silicone compositions before cure have a viscosity of <20,000 cp as measured using a Brookfield viscometer. After cure, the anti-dust coatings also have a high thermal stability with less than 1% weight loss at 250° C. under nitrogen for 1 hour. Where the substrate is a silicone substrate, the anti-dust coatings described herein have a higher hardness than the hardness of the silicone substrate and, where used, the optically clear silicone substrate. The anti-dust coatings also have a comparative or a lower surface energy than the silicone-based articles and can be readily spread onto the surface of the silicone-based articles. The anti-dust coatings described herein are also solventless, thus eliminating various solvent-handling problems and avoiding PDMS swell issues.

While the invention is susceptible to various modifications and alternative forms, specific embodiments are described by way of example herein, and the invention is not intended to be limited to the particular forms disclosed. Rather, the invention is intended to cover all modifications, equivalents, and alternatives falling within the spirit and scope of the invention.

EXAMPLES

These examples are intended to illustrate the invention to one of ordinary skill in the art and should not be interpreted as limiting the scope of the invention set forth in the claims. All parts and percentages in the examples are on a weight basis and all measurements were indicated at about 23° C., unless indicated to the contrary.

General Methods and Measurements

The formulations were mixed using a dental cup mixer, SpeedMixer Model #DAC 150 FVZ, (available from Flack-Tek, Inc. in Landrum, S.C.). The viscosity of the final formulations was measured using a Brookfield Viscometer (model #DV-E Viscometer). The formulations were coated on the top of a glass substrate using a draw-down bar for 20 micron coating thickness. The coatings were cured on the substrate under UV-radiation (1J dosage) using an instrument manufactured by Fusion Systems Corporation (Decatur, Ga.) (Model: 31983-E). The retention time for UV-radiation was controlled by the speed of belt. The UV dosage was measured by passing a UV dosage meter through the moving UV channel. The coating's pencil hardness was measured according to ASTM D3363-05. For modulus and hardness testing, five indentations were performed on each sample using a Berkovich tip and a nominal indentation depth of 100 nm. Each indentation consisted of a 10-second loading cycle followed by a 10-second unloading cycle. Modulus and hardness were determined by analyzing the unloading curve according to the method of Oliver and Pharr (Oliver, W. C. and Pharr, G. M., *J. Mater. Res.* 1992, 7, 1564-83). The unloading curve was fit between 20-95% of its maximum value. Dynamic mechanical analysis (DMA) was performed using a single cantilever clamp with an amplitude of 10 µm at a frequency of 1 Hz. The samples were first equilibrated at 20° C. and then ramped up to 250° C. at a rate of 3° C./min. The following abbreviation is used for the epoxy groups in the examples: CHEp is 2-(3,4-epoxycyclohexyl)ethyl group and GEp is 3-glycidoxypropyl group.

Example 1: Synthesis of Formulation 1

To an amber dental-mixer cup was added 99.0 g of an epoxysilicone resin with a structure of $M_{0.31}T^{CHEp}_{0.17}Q_{0.52}$ as identified by $^{29}$Si-NMR and 1.0 g of a PAG, containing 30 to 60 wt. % of bis(4-dodecylphenyl)iodonium hexafluoroantimonate commercially available under the name of UV 9390C from Craig Adhesive and Coating Co. (Newark, N.J.). The mixture was mixed with a dental mixer (Model #DAC 150FVZ). The formulated liquid material was casted onto the top surface of a glass slide or poured into a framed stainless steel case. The liquid material was then cured under UV-irradiation (UV broadband, 1 J dosage) at room temperature (RT). The cured samples were tested as detailed below and the results are shown in Table A below.

Example 2: Synthesis of Formulation 2

To an amber dental-mixer cup was added 45.0 g of an epoxysilicone resin with a structure of $M_{0.31}T^{CHEp}_{0.17}Q_{0.52}$ as identified by $^{29}$Si-NMR, 45 g of bis[2-(3,4-epoxycyclohexyl)ethyl]tetramethyldisiloxane, 6 g of tetrakis [2-(3,4-epoxycyclohexyl)ethyl dimethylsiloxy] silane, 3 g of [2-(3,4-epoxycyclohexyl)ethyl]trimethoxysilane, and 1.0 g of UV 9390C. The mixture was mixed with a dental mixer (Model #DAC 150FVZ). The formulated liquid material was casted onto the top surface of a glass slide or poured into a framed stainless steel case. The liquid material was then cured under UV-irradiation (UV broadband, 1 J dosage) at RT. The cured sample was tested as detailed below and the results are shown in Table A below.

Example 3: Synthesis of Formulation 3

To an amber dental-mixer cup was added 99.0 g of an epoxy silicone resin with a structure of $M_{0.32}T^{GEp}_{0.16}Q_{0.52}$ as identified by $^{29}$Si-NMR and 1.0 g of UV 9390C. The mixture was mixed with a dental mixer (Model #DAC 150FVZ). The formulated liquid material was casted onto the top surface of a glass slide or poured into a framed stainless steel case. The liquid material was then cured under UV-irradiation (UV broadband, 1J dosage) at room temperature (RT). The cured samples were tested as detailed below and the results are shown in Table A below. The DMA thermogram of the cured sample of Example 3 is shown in FIG. 1. As shown in the FIG. 1, the UV cured material show a high storage modulus above 700 MPa at 23° C. and 300 MPa at 250° C.

Example 4: Synthesis of Formulation 4

Figure 2:
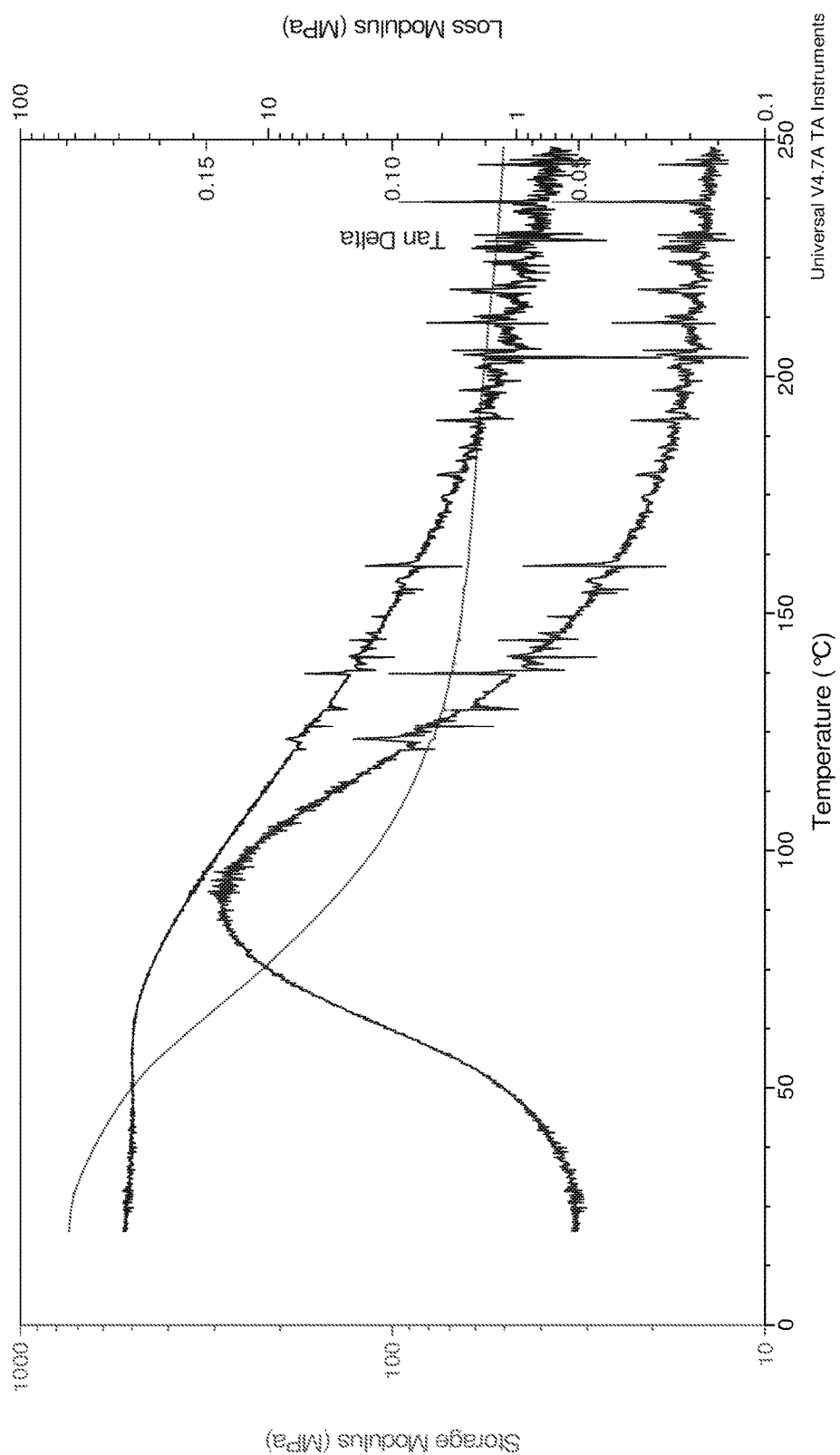
FIG. 2 is a DMA thermogram of the cured sample of Example 4 detailed herein formed using methods of the invention.

To an amber dental-mixer cup was added 45.0 g of an epoxysilicone resin with a structure of $M_{0.32}T^{GEp}_{0.16}Q_{0.52}$ as identified by $^{29}$Si-NMR, 45 g of bis[2-(3,4-epoxycyclohexyl)ethyl]tetramethyldisiloxane, 6 g of tetrakis [2-(3,4-epoxycyclohexyl)ethyl dimethylsiloxy] silane, 3 g of (3-glycidoxypropyl)trimethoxysilane, and 1.0 g of UV 9390C. The mixture was mixed with a dental mixer (Model #DAC 150FVZ). The formulated liquid material was casted onto the top surface of a glass slide or poured into a framed stainless steel case. The liquid material was then cured under UV-irradiation (UV broadband, 1J dosage) at RT. The cured samples were tested as detailed below and the results are shown in Table A below. The DMA thermogram of the cured sample of Example 4 is shown in FIG. 2. As shown in the FIG. 2, the UV cured material shows a high storage modulus (~700 MPa) at 23° C. and a significant drop to only 80 MPa at 250° C.

Examples 5-7

Synthesis of Formulations 5-7

To an amber dental-mixer cup was added 9.9 g of an epoxysilicone resin with a structure shown in Table A and 0.1 g of UV 9390C. The mixture was mixed with a dental mixer (Model #DAC 150FVZ). The formulated liquid material was casted onto the top surface of a glass slide or poured into a framed stainless steel case. The liquid material was then cured under UV-irradiation (UV broadband, 1 J dosage) at RT. The cured samples were tested as detailed below and the results are shown in Table A below.

Summary of Examples 1-7

A summary of the results of the epoxysilicone resin formulations formed in Examples 1-7 is set forth in Table A.

TABLE A

Summary of Epoxysilicone Resins Formed in Examples 1-7

| | Formulation[1] | | Properties of UV Cured Materials[3] | | |
|---|---|---|---|---|---|
| Ex. | Epoxysilicone Resin Structure (wt. %) | Epoxy Additives | Modulus (GPa)[2] | Hardness (MPa)[2] | Pencil Hardness |
| 1 | $M_{0.31}T^{CHEp}{}_{0.17}Q_{0.52}$ (99.0 wt. %) | No | 3.6 | 152 | 9H |
| 2 | $M_{0.31}T^{CHEp}{}_{0.17}Q_{0.52}$ (45.0 wt. %) | 54 wt. % | 2.4 | 69 | 6H |
| 3 | $M_{0.32}T^{GEp}{}_{0.16}Q_{0.52}$ (99.0 wt. %) | No | 1.9 | 113 | 6H |
| 4 | $M_{0.32}T^{GEp}{}_{0.16}Q_{0.52}$ (45.0 wt. %) | 54 wt. % | 1.5 | 46 | 4H |
| 5 | $M_{0.36}D^{GEp}{}_{0.16}Q_{0.48}$ (99.0 wt. %) | No | 1.1 | 32 | 2H |
| 6 | $M_{0.37}M^{GEp}{}_{0.16}Q_{0.47}$ (99.0 wt. %) | No | 0.73 | 21 | H |
| 7 | $M_{0.32}D^{GEp}{}_{0.06}T^{GEp}{}_{0.12}Q_{0.50}$ (99.0 wt. %) | No | 1.3 | 27 | 2H |

[1]The compositions contained 1% wt. % of UV9390C.
[2]These values were measured by nano-indentation technique.
[3]UV cured coating: 20 micron thickness on glass substrates.

Examples 8-10: UV Coating Formulations Containing $((CH_3)_3SiO_{1/2})_x[(RSiO_{3/2})_a(RR^1SiO_2)_b(RR^1R^2SiO_2)_c]_y(SiO_2)_z$ on PDMS-Based LED Encapsulation Sheet as Anti Dust Coating A silicone resin having the general formula:

$$((CH_3)_3SiO_{1/2})_x[(RSiO_{3/2})_a(RR^1SiO_2)_b(RR^1R^2SiO_2)_c]_y(SiO_2)_z$$

was mixed with a cationic photoinitiator to form the UV-curable silicone compositions listed in Table B:

TABLE B

| Example | Comments | UV-curable Epoxy Formulation* | Viscosity (cP) |
|---|---|---|---|
| 8 (control) | Sample w/o Coating | n/a | n/a |
| 9 (coating 1) | Sample w/ Coating 1 | $M_{0.24}T^{CHEP}{}_{0.30}Q_{0.46}$ (99.0 wt. %) | 700 |
| 10 (coating 2) | Sample w/ Coating 2 | $M_{0.31}T^{GEP}{}_{0.16}Q_{0.53}$ (99.0 wt. %) | 12,000 |

*Containing 1% wt. % of UV9390C.

Under amber-light conditions, the UV-curable silicone formulations listed in Table B were spread uniformly using a draw-down bar to a 5 micron thickness coating on the surface of a clear PDMS-based LED encapsulation sheet MS-1002 (dimension: 5.08 cm×5.08 cm×3.81 cm) to a coating thickness of 50 microns. The sheet was placed on the belt and the top coating layer was then cured under UV-radiation (1 J dosage).

Anti-Dust Test: An Ashrae test dust #2 was used for the anti-dust and its dust composition is shown in Tables C and D. The test was run using Dust, ASHRAE Test Dust #2 (http://www.powdertechnologyinc.com/product/ashrae-test-dust-2) per ANSI/ASHRAE 52.2P. Dust was applied onto the coated sides of the test samples by placing the test samples individually into a dust chamber containing 50 g of dust. The chamber was sealed and each test sample was separately subjected to shaking for 30 seconds.

TABLE C

| | CAS Number | % of Weight |
|---|---|---|
| 93.5% ISO 12103-1, A2 FINE TEST DUST | | |
| Chemical Ingredient | | |
| $SiO_2$ | 14808-60-7 | 68-76 |
| $Al_2O_3$ | 1344-28-1 | 10-15 |
| $Fe_2O_3$ | 1309-37-1 | 2-5 |
| $Na_2O$ | 1313-59-3 | 2-4 |
| CaO | 1305-78-8 | 2-5 |
| MgO | 1309-48-4 | 1-2 |
| $TiO_2$ | 13463-67-7 | 0.5-1.0 |
| K—O | 12136-45-7 | 2-5 |
| 6.5% MILLED COTTON LINTERS | | |
| Name | | |
| Second-Cut Cotton Linters | 9004-34-6 | 100.0 |

TABLE D

| Size Micrometer | ISO 12103-1, A2 Fine Test Dust % Less Than |
|---|---|
| 1 | 2.5-3.5 |
| 2 | 10.5-12.5 |
| 3 | 18.5-22.0 |
| 4 | 25.5-29.5 |
| 5 | 31.0-36.0 |
| 7 | 41.0-46.0 |
| 10 | 50.0-54.0 |
| 20 | 70.0-74.0 |
| 40 | 88.0-91.0 |
| 80 | 99.5-100 |
| 120 | 100 |
| 180 | — |
| 200 | — |

Figure 3:
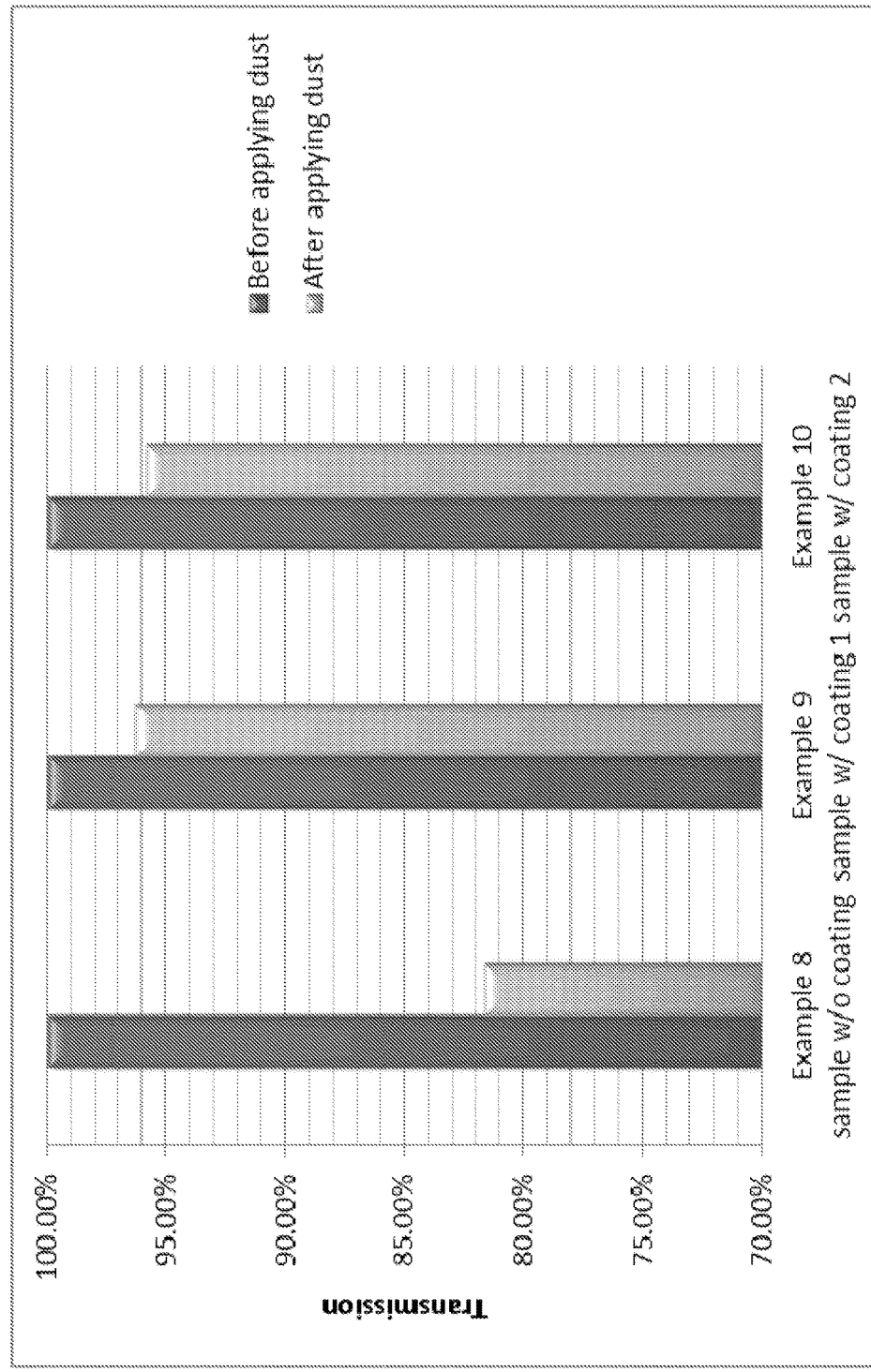
FIG. 3 is a graph showing the optical transmission rate of testing samples formed using methods of the invention before and after applying dust.

The optical transmission rate of the testing samples before and after applying the dust were measured using a Konika Minolta Spectrometer CM-5, and the results are shown in FIG. 3. The baseline optical measurements were performed using the PDMS-based LED encapsulation sheet MS-1002 (dimension: 5.08 cm×5.08 cm×3.81 cm) as a control sample. More specifically, as can be seen in FIG. 3, after applying dust on original (control) sample without the resin coating (Example 8), the transmission value decreased from 100% to 81.6%. In comparison, the transmission value only reduced from 100% to 96.2% for the PDMS-based LED encapsulation sheet MS-1002 with a silicone resin coating (Example 9) and from 100% to 95.9% with a silicone resin coating (Example 10). In other words, after applying dust on the Example 8, the transmission value dropped 18.36%. In comparison, the transmission value dropped less than 4% on the samples containing an anti-dust coating (Examples 9 and 10). Overall, as can be seen in FIG. 3, the samples with anti-dust coating (Examples 9 and 10) maintained a much better transmission value than the sample lacking the anti-dust coating (Example 8).

Alternative Aspects

1. A UV-curable silicone composition comprising: (a) a silicone resin having the general formula: $((CH_3)_3SiO_{1/2})_x[(RSiO_{3/2})_a(RR^1SiO_{2/2})_b(RR^1R^2SiO_{1/2})_c]_y(SiO_{4/2})_z$ wherein each R is an epoxy group, $R^1$ and $R^2$ are each independently an alkyl group or an aryl group, x, y, z>0, x+y+z=1, a+b+c=y, 0≤a≤y, 0≤b≤y, and 0≤c≤y; and (b) a cationic photoinitiator.

2. The UV-curable silicone composition of aspect 1, wherein R is an epoxy group containing a three member oxirane ring.

3. The UV-curable silicone composition of any one of the preceding aspects, wherein R is an epoxy group containing a three member oxirane ring selected from a 3-glycidoxypropyl group or a 2-(3,4-epoxycyclohexyl)ethyl group.

4. The UV-curable silicone composition of any one of the preceding aspects, wherein the UV-curable silicone composition is mixed with one or more organic solvents.

5. The UV-curable silicone composition of any one of the preceding aspects, wherein the UV-curable silicone composition is mixed with one or more epoxy monomers or polymers.

6. The UV-curable silicone composition of any one of the preceding aspects, wherein the UV-curable silicone composition includes a filler.

7. A cured composition comprising the UV-curable silicone composition of any one of the preceding aspects.

8. A substrate coated with the cured composition of aspect 7.

9. The substrate of aspect 8, wherein the substrate is an optically clear silicone substrate.

10. A method for preparing an anti-dust coating comprising spray coating, dip coating, or spin coating the UV-curable silicone composition according to any one of aspects 1-6 on a surface of a substrate to form a liquid coating thereon, drying the liquid coating at room temperature, and curing the dried coating by ultraviolet radiation.

11. An anti-dust coating prepared by the method of aspect 10.

12. An article comprising the anti-dust coating of aspect 11.

13. The article of aspect 12 which is an LED package, encapsulant, lamp, luminaire, or optical article.

14. A UV-curable silicone composition according to any one of aspects 1-6 applied onto an optically clear substrate as an anti-dust coating to reduce dust attraction.

15. A method of coating a substrate with an anti-dust coating comprising (a) applying the UV-curable silicone composition of any of aspects 1-6 onto a substrate to form a liquid coating thereon, and (b) curing the liquid coating to form the anti-dust coating, wherein the anti-dust coating has a pencil hardness greater than H.

16. The method of aspect 15, wherein the substrate is an optically clear silicone substrate.

17. The method of aspect 16, wherein the anti-dust coating has a higher hardness than a hardness of the optically clear silicone substrate.

18. The method of aspect 16, wherein the optically clear silicone substrate is a silicone-based moldable LED encapsulant or a secondary optical article.

19. A method of forming a cured silicone anti-dust coating composition comprising: (a) mixing a silicone resin having the general formula: $((CH_3)_3SiO_{1/2})_x[(RSiO_{3/2})_a(RR^1SiO_{2/2})_b(RR^1R^2SiO_{1/2})_c]_y(SiO_{4/2})_z$ wherein each R is an epoxy group, $R^1$ and $R^2$ are each independently an alkyl group or an aryl group, x, y, z>0, x+y+z=1, a+b+c=y, 0≤a≤y, 0≤b≤y, and 0≤c≤y, with a cationic photoinitiator to form a UV-curable silicone composition; and (b) applying the UV-curable silicone composition onto a substrate to form a liquid coating thereon; and (c) curing the liquid coating by ultraviolet radiation to form the cured silicone anti-dust coating composition.

20. The cured silicone anti-dust coating composition formed using the method of aspect 19.

While the invention is susceptible to various modifications and alternative forms, specific embodiments have been shown by way of example in the drawings and described in detail herein. It should be understood, however, that the invention is not intended to be limited to the particular forms disclosed. Rather, the invention is to cover all modifications, equivalents, and alternatives falling within the spirit and scope of the invention as defined by the appended claims.

The invention claimed is:

1. A UV-curable silicone composition comprising:
(a) a silicone resin having the general formula:

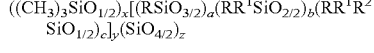

wherein each R is an epoxy group, $R^1$ and $R^2$ are each independently an alkyl group or an aryl group, x, y, z>0, x+y+z=1, a+b+c=y, 0≤a≤y, 0≤b≤y, and 0≤c≤y, a+b>0, and a+b≤y; and
(b) a cationic photoinitiator.

2. The UV-curable silicone composition of claim 1, wherein R is an epoxy group containing a three member oxirane ring selected from a 3-glycidoxypropyl group or a 2-(3,4-epoxycyclohexyl)ethyl group.

3. The UV-curable silicone composition of claim 1, wherein the UV-curable silicone composition is mixed with one or more epoxy monomers or polymers.

4. The UV-curable silicone composition of claim 1, wherein the UV-curable silicone composition includes a filler.

5. A cured composition comprising the UV-curable silicone composition of claim 1.

6. A substrate coated with the cured composition of claim 5, wherein the substrate is an optically clear silicone substrate.

7. A method for preparing an anti-dust coating comprising spray coating, dip coating, or spin coating the UV-curable silicone composition according to claim 1 on a surface of a substrate to form a liquid coating thereon, and curing the coating by ultraviolet radiation.

8. An anti-dust coating prepared by the method of claim 7.

9. An article comprising the anti-dust coating of claim 8, wherein the article is an LED package, encapsulant, lamp, luminaire, or optical article.

10. A UV-curable silicone composition according to claim 1 applied onto an optically clear substrate as an anti-dust coating to reduce dust attraction.

11. A method of coating a substrate with an anti-dust coating comprising
    a. applying the UV-curable silicone composition of claim 1 onto a substrate to form a liquid coating thereon, and
    b. curing the liquid coating to form the anti-dust coating, wherein the anti-dust coating has a pencil hardness greater than H.

12. The method of claim 11, wherein the substrate is an optically clear silicone substrate which is a silicone-based moldable LED encapsulant or a secondary optical article.

13. The method of claim 12, wherein the anti-dust coating has a higher hardness than a hardness of the optically clear silicone substrate.

14. A method of forming a cured silicone anti-dust coating composition comprising:
    (a) mixing a silicone resin having the general formula:

$((CH_3)_3SiO_{1/2})_x[(RSiO_{3/2})_a(RR^1SiO_{2/2})_b(RR^1R^2SiO_{1/2})_c]_y(SiO_{4/2})_z$ wherein each R is an epoxy group, $R^1$ and $R^2$ are each independently an alkyl group or an aryl group, x, y, z>0, x+y+z=1, a+b+c=y, 0≤a≤y, 0≤b≤y, and 0≤c≤y, a+b>0, and a+b≤y;
    with a cationic photoinitiator to form a UV-curable silicone composition; and
    (b) applying the UV-curable silicone composition onto a substrate to form a liquid coating thereon; and
    (c) curing the liquid coating by ultraviolet radiation to form the cured silicone anti-dust coating composition.

15. The cured silicone anti-dust coating composition formed using the method of claim 14.

* * * * *